United States Patent
Peng et al.

(10) Patent No.: US 10,886,252 B2
(45) Date of Patent: Jan. 5, 2021

(54) METHOD OF BONDING SEMICONDUCTOR SUBSTRATES

(71) Applicant: IMEC VZW, Leuven (BE)

(72) Inventors: Lan Peng, Leuven (BE); Soon-Wook Kim, Heverlee (BE); Eric Beyne, Heverlee (BE); Gerald Peter Beyer, Heverlee (BE); Erik Sleeckx, Steenokkerzeel (BE); Robert Miller, Lubbeek (BE)

(73) Assignee: IMEC vzw, Leuven (BE)

(*) Notice: Subject to any disclaimer, the term of this patent is extended or adjusted under 35 U.S.C. 154(b) by 11 days.

(21) Appl. No.: 15/908,641

(22) Filed: Feb. 28, 2018

(65) Prior Publication Data
US 2018/0247914 A1 Aug. 30, 2018

(30) Foreign Application Priority Data
Feb. 28, 2017 (EP) .................................... 17158430

(51) Int. Cl.
*H01L 23/00* (2006.01)
*H01L 23/522* (2006.01)
(Continued)

(52) U.S. Cl.
CPC .......... *H01L 24/83* (2013.01); *H01L 21/2007* (2013.01); *H01L 23/528* (2013.01);
(Continued)

(58) Field of Classification Search
CPC ................. H01L 24/83; H01L 23/5226; H01L 2224/8389; H01L 21/2007;
(Continued)

(56) References Cited

U.S. PATENT DOCUMENTS

| 2001/0001707 A1 | 5/2001 | Chen et al. |
| 2005/0173057 A1 | 8/2005 | Suga et al. |

(Continued)

FOREIGN PATENT DOCUMENTS

| EP | 1 518 669 A2 | 3/2005 |
| WO | WO 2016/083332 | 6/2016 |

OTHER PUBLICATIONS

European Patent Office Search Report for Application No. 17158430.3 dated Aug. 25, 2017 in 8 pages.
(Continued)

*Primary Examiner* — Latanya N Crawford Eason
(74) *Attorney, Agent, or Firm* — Knobbe, Martens, Olson & Bear, LLP

(57) ABSTRACT

The disclosed technology generally relates to integrating semiconductor dies and more particularly to bonding semiconductor substrates. In an aspect, a method of bonding semiconductor substrates includes providing a first substrate and a second substrate. Each of the first substrate and the second substrate comprises a dielectric bonding layer comprising one or more a silicon carbon oxide (SiCO) layer, a silicon carbon nitride (SiCN) layer or a silicon carbide (SiC) layer. The method additionally includes, prior to bonding the first and second substrates, pre-treating each of the dielectric bonding layer of the first substrate and the dielectric bonding layer of the second substrate. Pre-treating includes a first plasma activation process in a plasma comprising an inert gas, a second plasma activation process in a plasma comprising oxygen, and a wet surface treatment including a water rinsing step or an exposure to a water-containing ambient. The method additionally includes bonding the first and the second substrates by contacting the dielectric bonding layer of the first substrate and the dielectric bonding layer of the second substrate to form a substrate assembly.

(Continued)

The method further includes post-bond annealing the assembly.

20 Claims, 4 Drawing Sheets

(51) Int. Cl.
*H01L 23/528* (2006.01)
*H01L 21/20* (2006.01)
*H01J 37/32* (2006.01)

(52) U.S. Cl.
CPC .......... *H01L 23/5226* (2013.01); *H01L 24/29* (2013.01); *H01L 24/32* (2013.01); *H01J 37/321* (2013.01); *H01J 37/32091* (2013.01); *H01J 2237/334* (2013.01); *H01L 2224/29082* (2013.01); *H01L 2224/29187* (2013.01); *H01L 2224/32145* (2013.01); *H01L 2224/83009* (2013.01); *H01L 2224/83011* (2013.01); *H01L 2224/83022* (2013.01); *H01L 2224/83895* (2013.01); *H01L 2224/83896* (2013.01); *H01L 2224/83948* (2013.01); *H01L 2224/83986* (2013.01); *H01L 2924/04642* (2013.01); *H01L 2924/059* (2013.01); *H01L 2924/20106* (2013.01); *H01L 2924/20107* (2013.01)

(58) Field of Classification Search
CPC . H01L 2224/29187; H01L 2224/83009; H01L 2224/83011; H01L 2224/83948; H01L 2224/83986; H01L 21/187
See application file for complete search history.

(56) References Cited

U.S. PATENT DOCUMENTS

| | | |
|---|---|---|
| 2010/0211849 A1 | 8/2010 | Djordjevic et al. |
| 2013/0207268 A1 | 8/2013 | Chapelon |
| 2013/0270328 A1* | 10/2013 | Di Cioccio ............. H01L 24/05 228/176 |
| 2017/0301646 A1 | 10/2017 | Kim et al. |
| 2019/0057897 A1* | 2/2019 | Kweskin ............. H01L 21/0214 |

OTHER PUBLICATIONS

Howlader, et al., "Sequential Plasma-Activated Bonding Mechanism of Silicon/Silicon Wafers," *Journal of Microelectromechanical Systems*, Aug. 2010, p. 840-848, vol. 19—Issue 4.

Liston, Edward M., "Plasma Treatment for Improved Bonding: A Review," *J. Adhesion*, 1989, p. 199-218, vol. 30, Gordon and Breach Science Publishers Inc., United Kingdom.

Peng, et al., "Investigation of oxygen followed by argon plasma treatment on LED chip bond pad for wire bond application," downloaded by KU Leuven University Library at 06:30 on Oct. 28, 2016; 2015, vol. 27—Issue 4 p. 129-136.

Suni et al., "Effects of Plasma Activation on Hydrophilic Bonding of Si and $SiO_2$," *Journal of Electrochemical Society*, Apr. 25, 2005, p. 348-351, vol. 149—Issue 6, Finland.

Zhang et al., "Surface and Interface Characterization of Sequentially Plasma Activated Silicon, Silicon dioxide and Germanium Wafers for Low Temperature Bonding Applications," *The Electrochemcal Society*, 2010, p. 329-338, vol. 33—Issue 4, Canada.

* cited by examiner

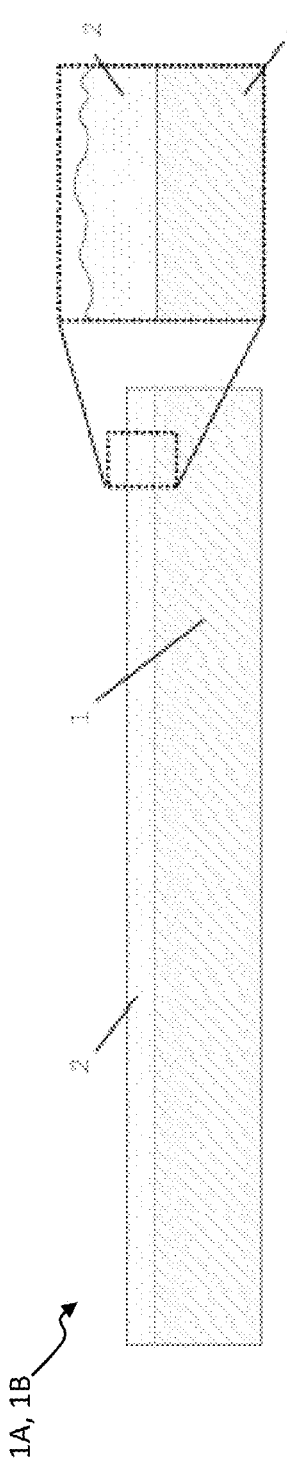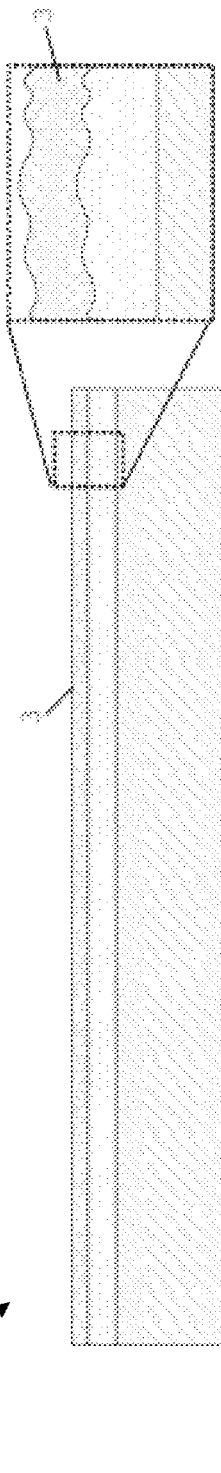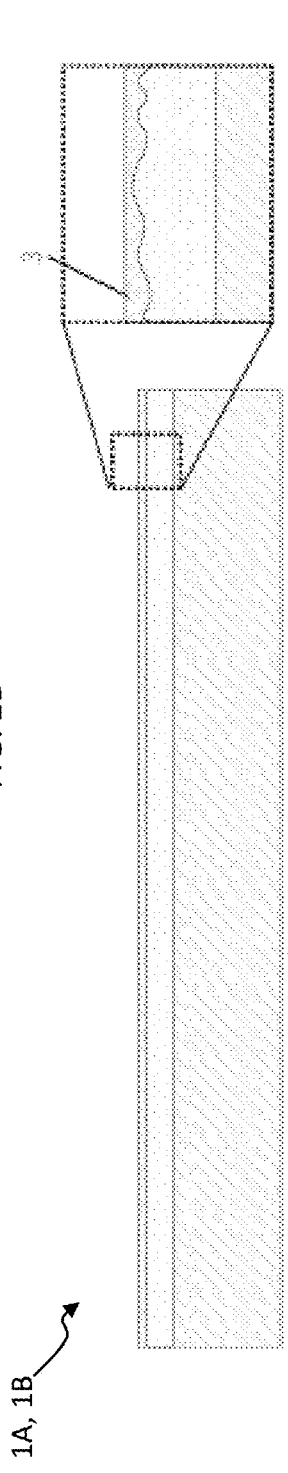
FIG. 2A
FIG. 2B
FIG. 2C

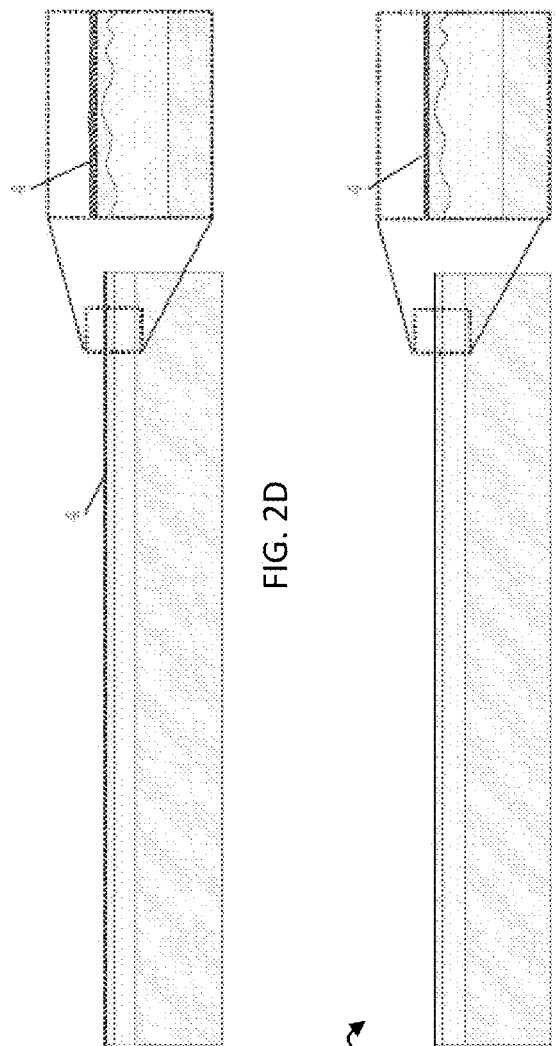

METHOD OF BONDING SEMICONDUCTOR SUBSTRATES

CROSS-REFERENCE TO RELATED APPLICATIONS

This application claims foreign priority to European Patent Application No. 17158430.3, filed Feb. 28, 2017, the content of which is incorporated by reference herein in its entirety.

BACKGROUND

Field

The disclosed technology generally relates to integrating semiconductor dies and more particularly to bonding semiconductor substrates.

Description of the Related Technology

Some wafer-level bonding methods, e.g., direct wafer level bonding referred to as wafer-to-wafer bonding, involve aligning and contacting two semiconductor wafers. Some of the methods are performed at room temperature and involve bonding silicon wafers having formed thereon dielectric bonding layers, followed by an annealing process. Without being bound to any theory, chemical bonds may be formed between the bonding layers during the annealing process.

Without loss of generality, wafer-to-wafer bonding techniques include two main categories. In a first category, the surfaces of both wafers have formed thereon a blanket, flat or unpatterned dielectric bonding layers, such as silicon oxide, silicon nitride or a silicon-carbon-oxide (low-k dielectric) layer. In a second category, the surfaces of both wafers have formed thereon a flat, patterned dielectric/metal layers. The techniques in the latter category are sometimes referred to as hybrid wafer bonding techniques. In these techniques, the main area fraction is covered by the dielectric material, while other areas are metallic, mainly forming contact pads and metal lines. Bonding between dielectric areas takes place by the same mechanism as described above in the first category of techniques. Locations where metallic areas overlap can be used to realize electrical contacts between the wafers.

For both categories, chemical mechanical polishing (CMP) can be applied to reduce the roughness of the dielectric layers prior to bonding. Surface treatments are applied such as plasma treatment and ultrasonic or other cleaning techniques. Post-bond annealing temperatures are generally higher than 400° C. in order to reach the desired bond strength. In order to reduce the thermal budget of the bonding process, it is desirable to obtain high strength bonds at lower temperatures. This is particularly important in the field of memory devices. For example, in non-volatile memory devices such as flash memory devices, higher post-bonding annealing processes may lead to undesirable initial shifts in threshold voltages.

The same problems are confronted in the die-to-wafer bonding processes, wherein a semiconductor chip is bonded to a carrier wafer by direct bonding. In the latter domain, some techniques employ silicon carbide nitride (SiCN) layers as the dielectric bonding layer. Reference is made to US 2013/0207268. However, the cited document fails to describe the bonding process in detail and no information is given on applicable annealing temperatures. US 2010/0211849 describes SiCN as a "bonding aid film" in a direct wafer-to-wafer bonding process. This process is however open to further improvement in terms of the thermal budget (the post-bonding annealing temperature is 400° C.).

Various plasma treatments of dielectric bonding surfaces prior to bonding have been described. A nitrogen-based plasma pre-treatment is known to improve the bond strength. Also sequential plasma treatments have been described. Document US 2005/0173057 for example describes a sequential treatment of Si or $SiO_2$ surfaces by a reactive ion etching (RIE) process under oxygen followed by a microwave plasma under nitrogen. For particular bonding layers, for example SiCN layers, these treatments are insufficient or unsuitable, and there is a need for improved methods for increasing the bond strength.

SUMMARY OF CERTAIN INVENTIVE ASPECTS

The disclosed technology aims to provide a method for bonding substrates by direct bonding between dielectric bonding layers on the surfaces of the substrates, wherein the bond strength is improved compared to existing techniques. The disclosed technology is related to a method according to the appended claims.

The method of the disclosed technology is a method for direct bonding of a first substrate to a second substrate, the first and second substrate comprising dielectric bonding layers, wherein the bonding takes place by bringing the dielectric bonding layers into mutual contact to form a substrate assembly and subjecting the assembly to a post-bond anneal, and wherein both bonding layers are subjected to a pre-treatment prior to bonding, the pre-treatment comprising the following steps performed in the order in which they are stated:
  a first plasma activation step in an inert gas plasma,
  a second plasma activation step in an oxygen plasma,
  a wet surface treatment including a water rinsing step or including an exposure to a water-containing ambient,
  and wherein the dielectric bonding layers on the two substrates are two SiCO layers, or two SiCN layer, or two SiC layers.

According to an embodiment, one or both of the plasma activation steps takes place in a plasma reactor for capacitively coupled plasma. Alternatively, one or both of the plasma activation steps may take place in a plasma reactor for inductively coupled plasma. According to a preferred embodiment, a DC bias voltage between the substrate and the plasma is not actively applied.

According to an embodiment, both plasma activation steps take place under the following conditions:
  the plasma is generated by a radio frequency power source,
  Pressure between 1.33 and 133.3 Pa (10 and 1000 mTorr)
  RF frequency between 100 KHz and 300 MHz
  RF power between 50 W and 300 W
  Temperature lower than 60° C.

More preferably, the RF frequency for both plasma activation steps is between 100 KH and 1 MHz.

The post-bond anneal temperature is preferably lower than 400° C., more preferably between 200° C. and 250° C. The inert gas may be argon. According to an embodiment, the wet surface treatment is performed in a timespan lower than under 300 s. The method may further comprise an intermediate cleaning step between the first and second plasma activation steps.

BRIEF DESCRIPTION OF THE DRAWINGS

FIGS. 2A-2F illustrate an example method of bonding semiconductor substrates.

DETAILED DESCRIPTION OF CERTAIN ILLUSTRATIVE EMBODIMENTS

Figure 2F:
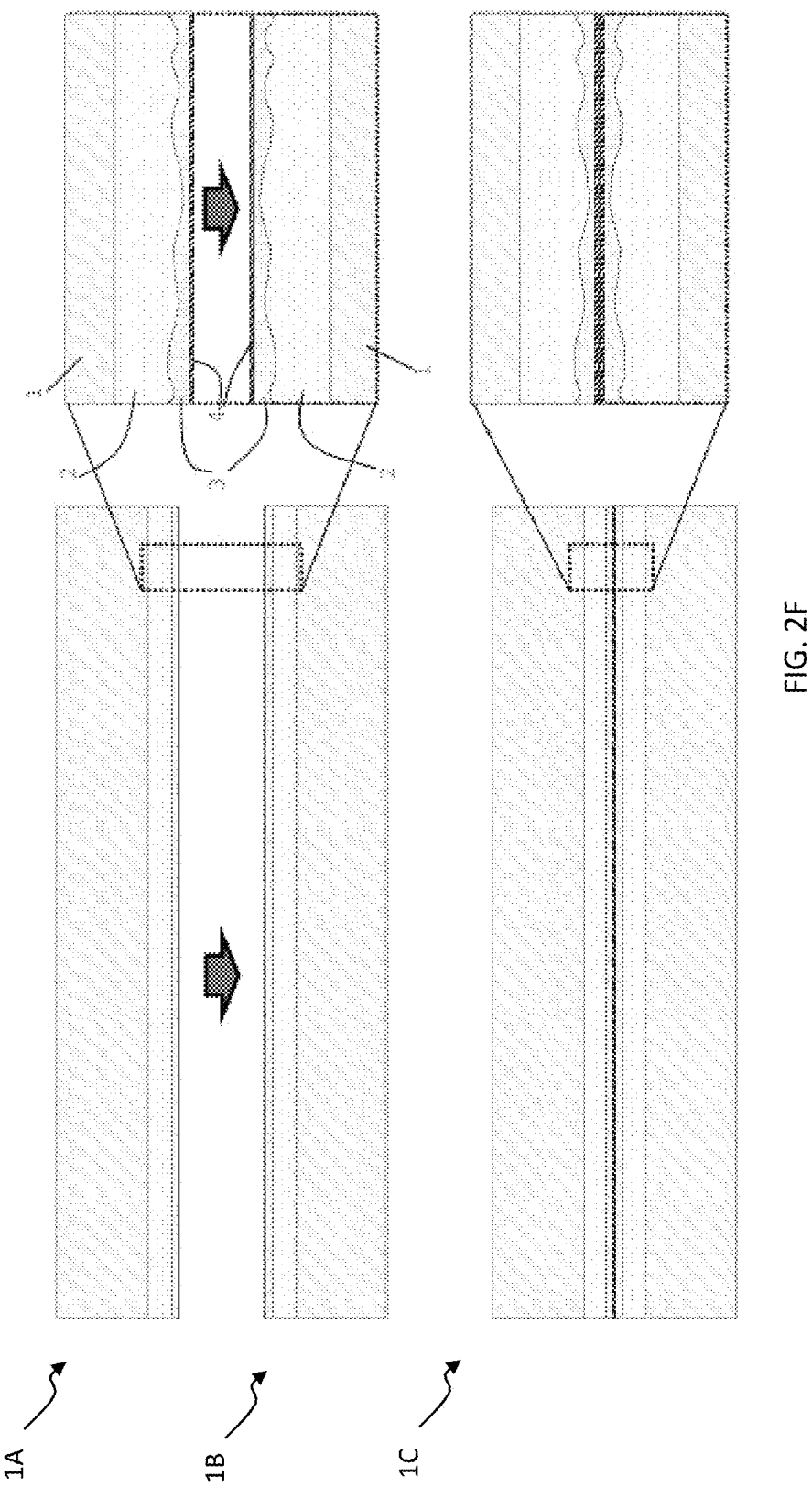

According to some embodiments, two substrates are bonded by wafer-to-wafer bonding processes described in US 2017/0301646, the content of which is incorporated herein by reference in its entirety. For example, referring to FIGS. 2A-2F, a method of bonding semiconductor substrates comprises providing (FIG. 2A) a first semiconductor substrate 1A and a second semiconductor substrate 1B, each including a silicon bulk portion 1 and a functional layer 2, to be bonded and pre-bond processing each of the first and second semiconductor substrates 1A, 1B prior to bonding. The pre-bond processing comprises depositing (FIG. 2B) a dielectric layer 3 on a major surface of the each of first and second semiconductor substrates 1A, 1B, chemical-mechanical polishing (FIG. 2C) the dielectric layer of the each of the first and second semiconductor substrates 1A, 1B to reduce the roughness of the dielectric layer, depositing a bonding layer 4 (FIG. 2D) on the dielectric layer 3 of the each of the first and second semiconductor substrates 1A, 1B, pre-bond annealing the each of the first and second semiconductor substrates 1A, 1B, and chemical-mechanical polishing (FIG. 2E) the bonding layer 4 to reduce the roughness of the bonding layer 4. The method additionally includes bonding (FIG. 2F) the bonding layers of first and second semiconductor substrates 1A, 1B, where bonding comprises aligning the first and second substrates 1A, 1B and contacting the bonding layers 4 of the first and second substrates 1A, 1B, thereby forming (FIG. 2F) an assembly 1C of bonded substrates. The method further comprises post-bond annealing the assembly 1C of bonded substrates.

The resulting bonded substrates forms an assembly 1C of bonded substrates comprising first and second substrates 1A, 1B. Each of the first and second substrates 1A, 1B comprises a functional layer 2 comprising semiconductor devices interconnected by back-end-of-the line metallization, a silicon oxide layer 3 formed on the functional layer 2, and a bonding layer 4 formed on the silicon oxide layer 3, wherein the silicon oxide layer 3 is planarized such that an interface formed between the bonding layer 4 and the silicon oxide layer 3 has a roughness less than or equal to 0.2 nm root mean square (RMS). The bonding layers 4 of the first and second layer are bonded to each other to form a bonded interface having a bond strength greater than about 2.0 $J/m^2$.

According to various embodiments disclosed herein, one or both of two substrates to be bonded may be processed according to any process described in US 2017/0301646. Additionally or alternatively, the substrates to be bonded, e.g., silicon wafers provided with respective dielectric bonding layers, may be subjected to the following processes described herein. In particular, the substrates to be bonded, prior to bonding, may be subjected to one or more of the following pre-treatment steps:

1. Activation using a plasma comprising argon (Ar), e.g., a plasma consisting essentially of argon;
2. Optionally an intermediate cleaning process comprising at least a water rinsing step, e.g., by deionized water;
3. Activation using a plasma comprising oxygen (O), e.g., a plasma consisting essentially of oxygen; and
4. Wet surface treatment including rinsing with (deionized) water. Alternatively, the wet surface treatment may include exposure of the plasma-treated surfaces to a $H_2O$-containing ambient.

In some embodiments, the above processes are executed in the numerical order given above. However, in some other embodiments, the process steps may be executed in a different order. The argon in the first step may be replaced by a suitable inert gas, e.g., He, N2, Xe or Ne. The inventors have found that the sequential plasma activation followed by the wet surface treatment results in superior bond strength, as will be illustrated by experimental data further in this description.

As described herein, plasma activation refers to a process wherein the surface of the substrate is treated by physical bombardment by plasma ions, but without substantial removal of the material of the substrate from the surface, i.e., without sputtering or etching the surface of the substrate. In other words, the substrate is not treated by reactive ion etching (RIE). Through the sputtering of plasma ions, the activation steps are configured to remove compounds that are chemically bonded to the surface, such as hydrocarbons, but not to significantly remove material from the surface itself.

The plasma activation in both plasma steps may be performed in a plasma reactor for capacitively coupled plasma (CCP), comprising a set of electrodes, wherein the first electrode is a planar electrode placed inside a reaction chamber and coupled to a radio-frequency (RF) voltage source and the second electrode is grounded. The enclosure that forms the chamber is preferably equally grounded. The second electrode may be formed by said enclosure that forms the chamber. A substrate to be pre-treated is mounted on the lower electrode (normally on a chuck designed to hold the substrate) and exposed to a plasma generated between the electrodes by the RF power. For realizing the argon or oxygen plasma activation steps of the method according to the disclosed technology, the plasma is generated by creating a vacuum in the reaction chamber and by supplying respectively argon or oxygen to the chamber. Under the influence of the RF power and the continued supply of Ar or O, a plasma is created and maintained between the electrodes. The plasma density is dependent on the RF power (the higher the power, the higher the density).

The use of a capacitively coupled plasma reactor enables the above described physical sputtering of plasma ions onto the wafer surface without reactive ion etching. One or both of the plasma steps may however also be performed in an inductively coupled plasma reactor, with the process parameters configured to obtain surface activation in the above-described sense. In an ICP reactor, the Ar or O based plasma is generated by an RF power source, between electrodes placed outside the reaction chamber and subsequently introduced in the chamber with the substrate to be treated placed therein. According to preferred embodiments, the plasma steps are not performed in a microwave plasma reactor.

In a CCP reactor, ions from the plasma are accelerated to the substrate by a DC bias voltage between the plasma and the RF powered electrode. The DC bias voltage is a consequence of the plasma formation and is influenced by the RF frequency. The DC bias can also be actively controlled to a desired value via a tuning network coupled between the RF-powered electrode and the RF source. In the case of ICP, a capacitively powered electrode can be used to control the bias of the wafer surface. According to preferred embodiments however, a DC bias voltage between the plasma and the substrate to be treated is not actively applied nor controlled. Thus, according to some embodiments, while the charged species such as ions bombarding the surface of the substrate may have some energy due to the plasma state, the charged species are not additionally accelerated towards the substrate by an externally applied DC bias to the substrate.

According to some embodiments, the RF frequency is less than 300 MHz. More preferably, the frequency is between 100 KHz and 1 MHz. Also, the RF power is preferably low, preferably between 50 and 300 W. Treatment durations during each of the plasma steps are kept low, preferably maximum 1 minute. The plasma steps take place at low temperatures, for example between 15° C. and 25° C., and preferably not higher than 60° C. The following table summarizes the preferred ranges for the plasma parameters (either performed in a CCP or ICP reactor) applicable in both plasma steps of the method of the disclosed technology:

| Pressure | 10 to 1000 mTorr (1.33 to 133.3 Pa) |
| --- | --- |
| RF power | 50 to 300 W |
| RF frequency | 100 kHz-300 MHz |
| Process time | 10 to 60 s |
| Temperature | <60° C. |

In the method of the disclosed technology, the bonding layers are formed of silicon carbon oxide or silicon carbon nitride or silicon carbide, hereafter abbreviated as SiCO or SiCN or SiC, i.e. a layer of SiCO or SiCN or SiC is provided on both substrates and direct bonding is established by a SiCO—SiCO bond or a SiCN—SiCN bond. SiCO is defined in the present context as the compound $SiC_yO_z$ with y between 0.4 and 1.2 and z between 0.2 and 1.0. SiCN, is defined in the present context by the formula $SiC_yN_z$ with y between 0.7 and 1.1 and z between 0.1 and 0.4. The term SiCN also includes layers of $SiC_yN_z$:H, wherein the H represents hydrogen atoms attached to the SiCN molecules. This may be obtained as a consequence of the precursors used in the deposition method for the SiCN layers. SiC is defined in the present context as the compound $SiC_y$ with y between 0.4 and 1.4.

According to embodiments, the thickness of the dielectric bonding layers is preferably between 10 nm and 1 micron, more preferably between 50 nm and 150 nm. The dielectric layers may be deposited on the substrate in any manner known in the art. They may be deposited directly on a semiconductor wafer or on other layers previously deposited on the wafer. Prior to the sequential plasma treatment according to the disclosed technology, the dielectric bonding layers are planarized by a suitable planarization process, preferably by chemical mechanical polishing. Planarization is performed according to known processes and to a degree of planarity that is suitable for performing a direct bonding technique. In other words, the disclosed technology is not limited by any particular process for producing the bonding layers on the substrates to be bonded, nor by any particular planarization process. In some embodiments, after planarization, the surface of the dielectric bonding layers has a roughness, e.g., a root mean squared roughness less than 0.1 nm.

An intermediate cleaning step between the plasma treatments is optional, as stated above. The final wet surface treatment, performed after the oxygen plasma activation. Without being bound to any theory, the wet surface treatment forms reactive OH groups on the surfaces of the bonding layers, which can be beneficial for the formation of a strong bond between contacting bonding layers of the substrates. The final wet surface treatment may include or consist of a suitable water rinsing step, applied for cleaning steps in a separate cleaning module. In addition to aiding the formation of the OH groups, the water rinse performs a cleaning of the surface. In some implementations, high efficiency cleaning techniques such as high pressure cleaning or megasonic cleaning could be incorporated in the water rinsing step. Instead of a water rinsing step, the final wet treatment may include or consist of exposing the dielectric bonding layers to a water-containing ambient, also resulting in the creation of reactive OH groups on the bonding surfaces. Without being bound to any theory, the plasma activation of the surfaces of the SiCN, SiCO or SiC layers are rendered highly hydrophilic and attracts water molecules with a high affinity interaction. In addition to the final wet surface treatment (including water rinsing or exposure to $H_2O$-containing ambient), alternative cleaning solutions such as diluted ammonia hydroxide-hydrogen peroxide-water mixture (APM) could also be used to remove other surface contaminants. This may be done before or after the wet treatment step. According to some embodiments, each of the substrates that are to be bonded receives the wet treatment (plus possibly treatment by other cleaning solutions) for less than 300 s, followed by a spin drying process. Tests performed by the inventors have shown that the amount of OH groups after the water rinse is higher when the plasma sequence according to the disclosed technology is applied compared to when an $N_2$ plasma treatment is used.

In addition to the formation of OH groups, the specific plasma sequence of the disclosed technology is highly effective due to the high density of carbon dangling bonds on the plasma-treated SiCO, SiCO or SiC surfaces, following the method steps according to the disclosed technology. These carbon dangling bonds on the two surfaces form strong carbon-carbon covalent bonds, thereby contributing in an important way to the superior bond strength achieved by the method of the disclosed technology. The presence of the high amounts of C-dangling bonds is also the reason why the method of the disclosed technology achieves high bond strength for SiCN, SiCO and SiC bonding layers, whereas the same method is far less effective when applied to $SiO_2$ bonding layers. Electron-spin-resonance (ESR) monitoring of dangling bonds (DB) have been invoked to compare SiCN—SiCN and $SiO_2$—$SiO_2$ bonding strength in terms of the evolution of chemical bond densities at the interface. The initial DB density (both carbon and silicon dangling bonds) before bonding was extracted from the specimens after plasma activation by argon plasma followed by oxygen plasma activation, and after rinsing. According to various embodiments, one or both of argon plasma activation and oxygen plasma activation results in a reduction in dangling bond density by at least 25%, 50%, 75%, or 90%. The total DB densities measured on the specimens before bonding were estimated at $2.4 \times 10E14/cm^2$ for SiCN, as opposed to $0.2 \times 10E14/cm^2$ for the $SiO_2$ bonding case. After bonding, the DB densities of SiCN—SiCN bonded specimens decrease to $1.2 \times 10E14/cm^2$ and $0.54 \times 10E14/cm^2$ for the post-bond annealing at 200° C. and 250° C., respectively. For $SiO_2$—$SiO_2$, there are practically no DB detected after the anneal. These results illustrate the important contribution of carbon dangling bonds to the bond strength in the case of SiCN. In the case of $SiO_2$, there is no major contribution to the chemical bond formation at the interface of $SiO_2$—$SiO_2$ by the effect of dangling bonds, because of the lower initial DB density prior to bonding. The bond strength in the case of $SiO_2$—$SiO_2$ bonds is primarily based on the influence of the OH-groups formed on the surfaces. This is the reason why the method of the disclosed technology has an important positive impact on the bond strength for the carbon-containing bonding layers SiCN, SiCO and SiC, whereas for $SiO_2$ bonding layers, this positive impact is not achieved. This will be illustrated by the following test results.

In various embodiments, the bonding layers of the first and second layer are bonded to each other to form a bonded interface having a bond strength greater than about 1.0, 1.6, 1.8, 2.0, 2.2 and 2.4 $J/m^2$ or a value within a range defined by any of these values. The bonding layers may be planarized layers such that the bonded interface has a roughness less than or equal to 0.1 nm root mean square (RMS). The presence of the bonded interface can be detected, e.g., using electron microscopy, X-ray photoelectron spectroscopy and secondary ion mass spectrometry, based on a mass contrast or deviation in stoichiometry. In embodiments, as bonded, the bonding layers form an interface having a concentration of Si, C, O and/or N that deviate at least 5%, 10%. 20%, 30%, or deviate by a percentage in a range defined by any of these values, from bulk regions of the bonding layers.

In some embodiments, each of the first and second substrates is a hybrid dielectric/metal wafer comprising a patterned surface having areas comprising a dielectric material and areas comprising a metal. In these embodiments, the each of the first and second substrates has metal-filled vias formed though the respective bonding layer, wherein corresponding ones of the metal-filled vias of the first and second substrates contact each other such that the functional layers of the first and second substrates are electrically connected to each other. Because the substrates are aligned within a tolerance, the corresponding ones of the metal-filled vias may be misaligned while still maintaining electrical contact.

Examples—Test Results

The inventors have performed comparative tests by treating planarized SiCO and SiCN bonding layers on silicon wafers by the method of the disclosed technology, compared to a pre-treatment by $N_2$ plasma activation. Comparative tests were also done on $SiO_2$ bonding layers. Tests were performed in a capacitively coupled plasma reactor under the following conditions, and at room temperature. The wet treatment step consisted in a deionized water rinse followed by a spin dry process in a wet cleaning module.

| N2 plasma treatment conditions | |
|---|---|
| Pressure | 350 mTorr |
| RF power | 100 W |
| RF frequency | 350 kHz |
| Process time | 15 s |
| N2 flow | 35 sccm* |
| Argon plasma treatment conditions | |
| Pressure | 350 mTorr |
| RF power | 200 W |
| RF frequency | 350 kHz |
| Process time | 15 s |
| Ar flow | 35 sccm* |
| Oxygen plasma treatment conditions | |
| Pressure | 350 mTorr |
| RF power | 200 W |
| RF frequency | 350 kHz |
| Process time | 15 s |
| Oxygen flow | 35 sccm* |

*The unit sccm stands for standard cubic centimetre per minute, the standard conditions being 0° C. and 1 atm (101325 Pa)

Figure 1:
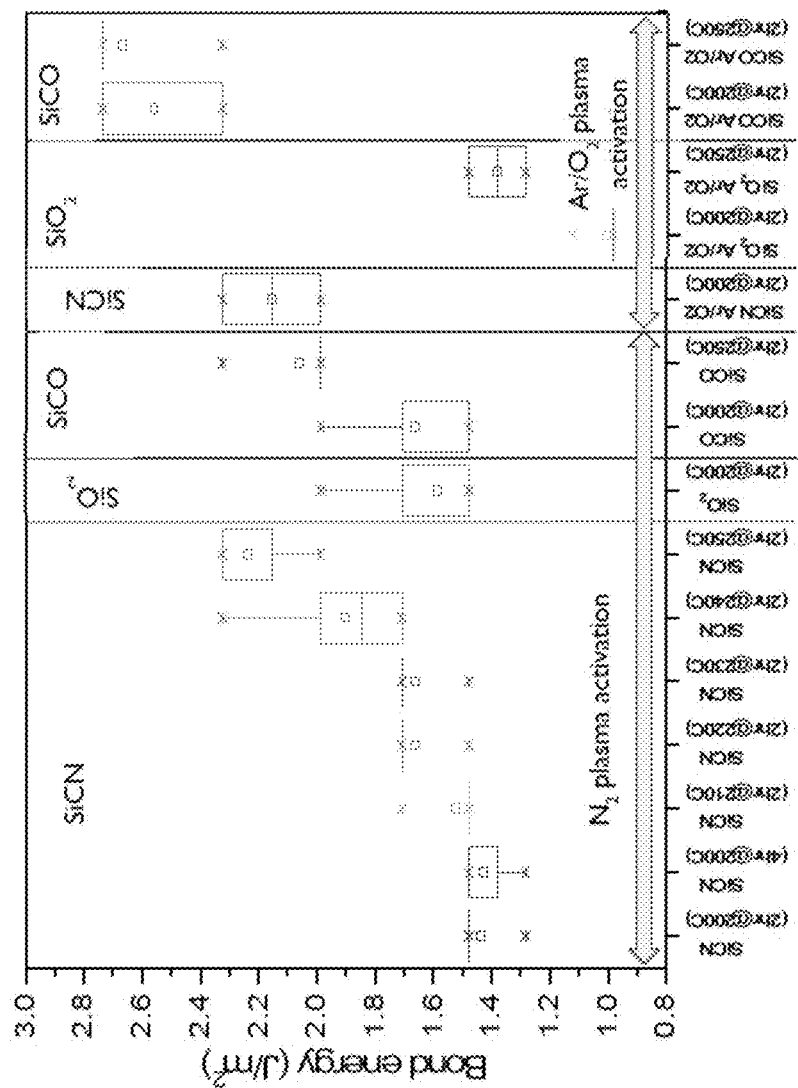
FIG. 1 compares test results obtained through the method of the disclosed technology to results obtained through a pre-existing treatment of the bonding surfaces.

Direct bonding by SiCO—SiCO bonding, SiCN—SiCN bonding or $SiO_2$—$SiO_2$ bonding was then performed. Post-bond annealing was done during 2 or 4 hours at 200° C., and in some cases at higher temperatures between 210° C. and 250° C., as indicated in the graph in FIG. 1. FIG. 1 shows the measured bond strength for the various experiments. The squares indicate average values of a number of measurements done for each condition outlined along the X-axis. It is clear that in the case of SiCN and SiCO, the Ar—$O_2$ pre-treatment according to the disclosed technology results in higher bond strength compared to the $N_2$-pretreatment applied in combination with the same or similar anneal temperature. Importantly, high bond strength is obtainable after post-bond annealing at a temperature of 200 and 250° C., i.e. lower than the post-bond anneal temperatures generally applied today. This means that the disclosed technology opens up potential for obtaining superior bond strength combined with a lower thermal budget. Higher post-bond anneal temperatures are however not excluded from the protection scope. According to an embodiment, the post-bond anneal temperature is lower than 400° C., more preferably maximum 350° C., more preferably maximum 250° C., more preferably between 200° C. and 250° C. The results for the $SiO_2$ bonding layers confirm the above-described influence of the increased density of carbon dangling bonds on SiCN and SiCO bonding layers pre-treated by the method of the disclosed technology. When applied to $SiO_2$, the method of the disclosed technology does not result in increased bonding strength compared to the $N_2$-plasma pre-treatment.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method of bonding semiconductor substrates, the method comprising:
   providing a first substrate and a second substrate, wherein each of the first substrate and the second substrate comprises a dielectric bonding layer comprising one or more of a silicon carbon oxide (SiCO) layer, a silicon carbon nitride (SiCN) layer or a silicon carbide (SiC) layer;
   pre-treating each of the dielectric bonding layer of the first substrate and the dielectric bonding layer of the second substrate, wherein pre-treating comprises the following processes:
      a first plasma activation process in a plasma comprising an inert gas,
      a second plasma activation process in a plasma comprising oxygen, and
      a wet surface treatment including a water rinsing step or an exposure to a water-containing ambient;
   bonding the first and the second substrates by contacting the dielectric bonding layer of the first substrate and the dielectric bonding layer of the second substrate to form a substrate assembly; and
   post-bond annealing the assembly.

2. The method according to claim 1, wherein the dielectric bonding layer of the first substrate is formed of the same material as the dielectric bonding layer of the second substrate.

3. The method according to claim 1, wherein the first plasma activation process precedes the second plasma activation process, and wherein the second plasma activation process precedes the wet surface treatment.

4. The method according to claim 1, wherein one or both of the first and second plasma activation processes are performed in a capacitively coupled plasma.

5. The method according to claim 1, wherein one or both of the first and second plasma activation processes are performed in an inductively coupled plasma.

6. The method according to claim 1, wherein a DC bias voltage between the substrate and the plasma is not actively applied.

7. The method according to claim 1, wherein the plasma used in one or both of the first and second plasma activation processes is generated by a radio frequency (RF) power source operated between 50 W and 300 W of power and between 100 KHz and 300 MHz in frequency, generated at a pressure between 1.33 and 133.3 Pa, and generated over each of the first and second substrates at a temperature lower than 60° C.

8. The method according to claim 7, wherein the plasma is generated by an RF power source is operated at a frequency between 100 KHz and 1 MHz.

9. The method according to claim 1, wherein the post-bond anneal is performed at a temperature lower than 400° C.

10. The method according to claim 9, wherein the post-bond anneal is performed at a temperature between 200° C. and 250° C.

11. The method according to claim 1, wherein the inert gas is argon.

12. The method according to claim 1, wherein the wet surface treatment is performed for a duration shorter than 300 sec.

13. The method according to claim 1, further comprising an intermediate cleaning process between the first and second plasma activation processes.

14. A method of bonding semiconductor substrates, the method comprising:
providing a first substrate and a second substrate, wherein each of the first substrate and the second substrate comprises a dielectric bonding layer comprising one or more of a silicon carbon oxide (SiCO) layer, a silicon carbon nitride (SiCN) layer or a silicon carbide (SiC) layer;
pre-treating each of the dielectric bonding layer of the first substrate and the dielectric bonding layer of the second substrate, wherein pre-treating comprises one or more plasma activation processes;
bonding the first and the second substrates by contacting the dielectric bonding layer of the first substrate and the dielectric bonding layer of the second substrate; and
post-bond annealing the assembly,
wherein an interface formed by bonded dielectric bonding layers of the first and second substrates has a dangling bond density that is lower by at least 25% relative to dangling bond, densities of each of the bonding layers of the first and second substrates prior to bonding.

15. The method according to claim 14, wherein the dielectric bonding layer of each of the first and second substrates comprises SiCN, wherein post-bond annealing is performed at a temperature exceeding 200° C., and wherein the dangling bond density of the interface is lower by at least 50% relative to the dangling bond densities of each of the bonding layers of the first and second substrates prior to bonding.

16. The method according to claim 14, wherein pre-treating comprises:
a first plasma activation process in a plasma comprising an inert gas,
a second plasma activation process in a plasma comprising oxygen, and
a wet surface treatment including a water rinsing step or an exposure to a water-containing ambient.

17. The method according to claim 14, wherein the interface has a bond strength greater than about 2.0 J/m$^2$.

18. The method according to claim 14, pre-treating each of the dielectric bonding layers of the first and second substrates is such that the interface has a roughness less than or equal to 0.1 nm root mean square (RMS).

19. The method according to claim 14, wherein the interface has a concentration of C that deviates at least 10% from bulk regions of each of the dielectric bonding layers of the first and second substrates.

20. The method according to claim 14, wherein each of the first and second substrates is a hybrid dielectric/metal wafer comprising a patterned surface having areas comprising a dielectric material and areas comprising a metal, and wherein the each of the first and second substrates has metal-filled vias formed though the respective dielectric bonding layer, wherein corresponding ones of the metal-filled vias of the first and second substrates contact each other such that the functional layers of the first and second substrates are electrically connected to each other.

\* \* \* \* \*

UNITED STATES PATENT AND TRADEMARK OFFICE
CERTIFICATE OF CORRECTION

PATENT NO. : 10,886,252 B2
APPLICATION NO. : 15/908641
DATED : January 5, 2021
INVENTOR(S) : Lan Peng It is certified that error appears in the above-identified patent and that said Letters Patent is hereby corrected as shown below:

On the Title Page

Item [57], under Abstract, Line 7, delete "more a" and insert --more of a--.

Page 2, Column 2, item [56], Line 17, delete "Electrochemcal" and insert --Electrochemical--.

In the Specification

Column 1, Line 31, delete "In a first category, the" and insert the same on Column 1, Line 32, as a new paragraph.

In the Claims

Column 10, Line 12, Claim 14, delete "bond," and insert --bond--.

Column 10, Lines 45, Claim 20, delete "though" and insert --through--.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*